United States Patent
Kim et al.

(10) Patent No.: US 9,173,281 B2
(45) Date of Patent: Oct. 27, 2015

(54) METHODS OF FABRICATING ELECTRODE SENSOR

(71) Applicant: Electronics and Telecommunications Research Institute, Daejeon (KR)

(72) Inventors: Yong Hee Kim, Daejeon (KR); Sang Don Jung, Daejeon (KR); Nam Seob Baek, Daejeon (KR); Gookhwa Kim, Jeonju (KR)

(73) Assignee: Electronics and Telecommunications Research Institute, Daejeon (KR)

(*) Notice: Subject to any disclaimer, the term of this patent is extended or adjusted under 35 U.S.C. 154(b) by 139 days.

(21) Appl. No.: 13/944,715

(22) Filed: Jul. 17, 2013

(65) Prior Publication Data
US 2014/0020936 A1    Jan. 23, 2014

(30) Foreign Application Priority Data

Jul. 19, 2012  (KR) .................. 10-2012-0078891
Dec. 17, 2012  (KR) .................. 10-2012-0147260

(51) Int. Cl.
  *H05K 3/02* (2006.01)
  *H05K 3/10* (2006.01)
  *H05K 1/02* (2006.01)
  *H05K 3/40* (2006.01)

(52) U.S. Cl.
CPC .. *H05K 1/02* (2013.01); *H05K 3/10* (2013.01); *H05K 3/4007* (2013.01); *H05K 2201/0257* (2013.01); *H05K 2201/099* (2013.01)

(58) Field of Classification Search
CPC ............. H01L 27/1288; H01L 2225/06524; H01L 2225/06541; H01L 27/1259; H05K 3/4007; Y10T 29/49126; Y10T 29/49155; Y10T 29/49165; H01S 5/0425
USPC ............. 29/846, 825, 829, 874; 257/72, 257/E21.412, E27.111, E29.137, E29.278; 438/149, 151, 154, 235, 285, 309, 312
See application file for complete search history.

(56) References Cited

U.S. PATENT DOCUMENTS 6,939,750 B2 *  9/2005  Hotta et al. .................. 438/149
7,064,021 B2 *  6/2006  Chang .......................... 438/154

OTHER PUBLICATIONS

J. Yu, et al., "An experimental study on micro-gas sensors with strip shape tin oxide thin films", Sensors and Actuators B: Chemical, 2009, pp. 346-352, vol. 139, Elsevier B.V.

Ju-Hyun Kim, et al., "Surface-modified microelectrode array with flake nanostructure for neural recording and stimulation", Nanotechnology, 2010, pp. 1-8, vol. 21, No. 085303, IOP Publishing Ltd.

* cited by examiner

*Primary Examiner* — Thiem Phan

(57) ABSTRACT

Provide are an electrode sensor and a method of fabricating the same. the method may include providing a substrate with a first electrode, forming a resist layer on the substrate to cover the first electrode, patterning the resist layer to expose a portion of the first electrode, forming an insulating layer on the substrate, removing the insulating layer on the resist layer and the resist layer to form a well in the insulating layer, and forming a second electrode in the well to be electrically connected to the first electrode. According to the method, it is possible to prevent the first electrode from being damaged. In addition, the second electrode may be configured have an increased surface area, and thus, the electrode can have low impedance.

7 Claims, 11 Drawing Sheets

METHODS OF FABRICATING ELECTRODE SENSOR

CROSS-REFERENCE TO RELATED APPLICATIONS

This U.S. non-provisional patent application claims priority under 35 U.S.C. §119 to Korean Patent Application Nos. 10-2012-0078891, filed on Jul. 19, 2012, and 10-2012-0147260, filed on Dec. 17, 2012, in the Korean Intellectual Property Office, the entire contents of which are hereby incorporated by reference.

BACKGROUND OF THE INVENTION

Example embodiments of the inventive concept relate to an electrode sensor and a method of fabricating the same.

An electrode may be used to provide or detect an electric signal to or from a sample. As a size of an electrode decreases, a surface area of the electrode is needed to be increased in order to prevent an increase in impedance of the electrode.

A surface state of the electrode is a key parameter affecting application and performance of the electrode. Accordingly, a surface of the electrode may be passivated with an insulating layer, and in order to detect signals, a portion of the electrode may be exposed by an etching process of the insulating layer. However, the electrode may be unintentionally etched during the etching of the insulating layer.

Conventionally, culturing solution is provided on a nerve electrode, and the presence of the culturing solution may lead to a difficulty in optically observing nerve cells adjacent to the nerve electrode. In addition, since the nerve electrode is opaque, it may be hard to observe the nerve cell through the nerve electrode.

SUMMARY

Example embodiments of the inventive concept provide an electrode sensor with high reliability and a method of fabricating the same.

Other example embodiments of the inventive concept provide an electrode sensor, which is configured to be able to observe a nerve cell and measure a signal from the nerve cell, and a method of fabricating the same.

According to example embodiments of the inventive concepts, a method of fabricating an electrode sensor may include providing a substrate with a first electrode, forming a resist layer on the substrate to cover the first electrode, patterning the resist layer to expose a portion of the first electrode, forming an insulating layer on the substrate, removing the insulating layer on the resist layer and the resist layer to form a well in the insulating layer, and forming a second electrode in the well to be electrically connected to the first electrode.

In example embodiments, the forming of the resist layer may include forming a lift-off resist layer on the substrate, and forming a photoresist layer on the lift-off resist layer.

In example embodiments, the insulating layer may be formed on the exposed portion of the first electrode and the resist layer.

In example embodiments, the removing of the insulating layer may be performed using developing solution or lift-off resist remover.

In example embodiments, the insulating layer may be formed to include a protruding portion provided around the resist layer.

In example embodiments, the forming of the well may include patterning the insulating layer to have a circular ring shape in plan view, and the forming of the second electrode may include filling the well with nano particles to form the second electrode having the circular ring shape.

In example embodiments, the forming of the well may include patterning the insulating layer to have a circular disc shape in plan view, and the forming of the second electrode may include filling the well with nano particles to form the second electrode having the circular disc shape.

According to example embodiments of the inventive concepts, an electrode sensor may include a substrate, a first electrode provided on the substrate to have a thin film structure, an insulating layer provided on the first electrode to have a well, and a second electrode provided in the well and electrically connected to the first electrode. The second electrode has a circular ring shape in plan view.

In example embodiments, the second electrode may include gold nano particles or platinum nano particles.

In example embodiments, the insulating layer may include a protruding portion provided around the well.

In example embodiments, the well has an undercut-shaped side surface.

In example embodiments, the first electrode may include at least one of gold, platinum, iridium, indium tin oxide, or conductive polymers, and the substrate and the insulating layer may be transparent.

According to example embodiments of the inventive concepts, an electrode sensor may include a metal layer provided on a substrate, an insulating layer provided on the substrate to cover the metal layer, a well provided in the insulating layer to expose a portion of the metal layer, and nano particles provided in the well and electrically connected to the metal layer. The insulating layer has a protruding portion provided around the well, and the well has an undercut-shaped structure.

In example embodiments, a thickness of the insulating layer may be greater than a depth of the well.

In example embodiments, a bottom diameter of the well may be greater than an intermediate diameter of the well.

In example embodiments, the well may be shaped like a circular disc or a circular ring, in plan view.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
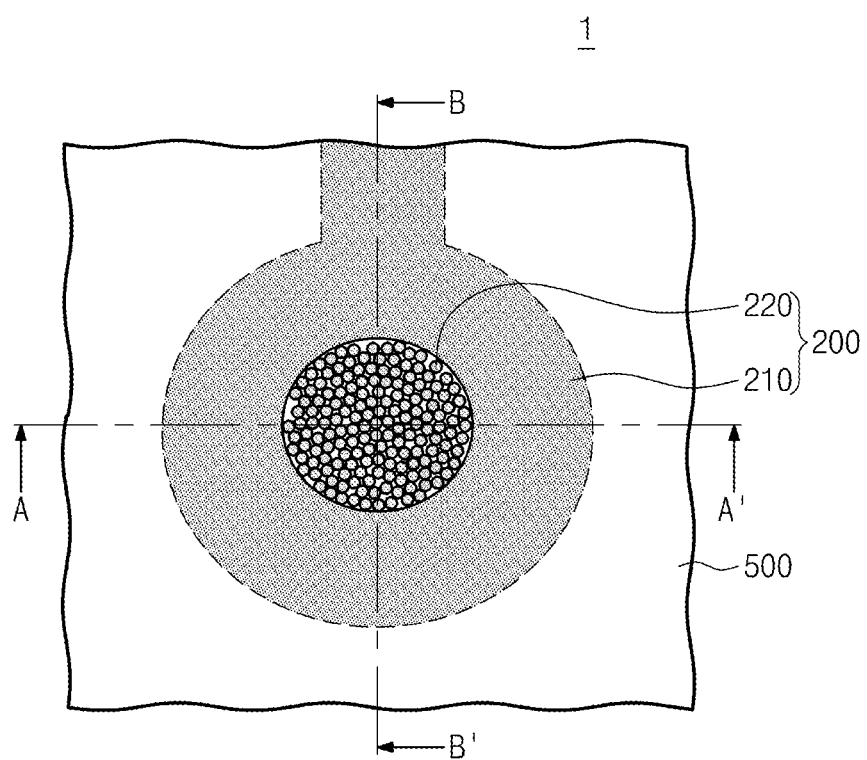
FIG. 1 is a plan view illustrating an electrode sensor according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
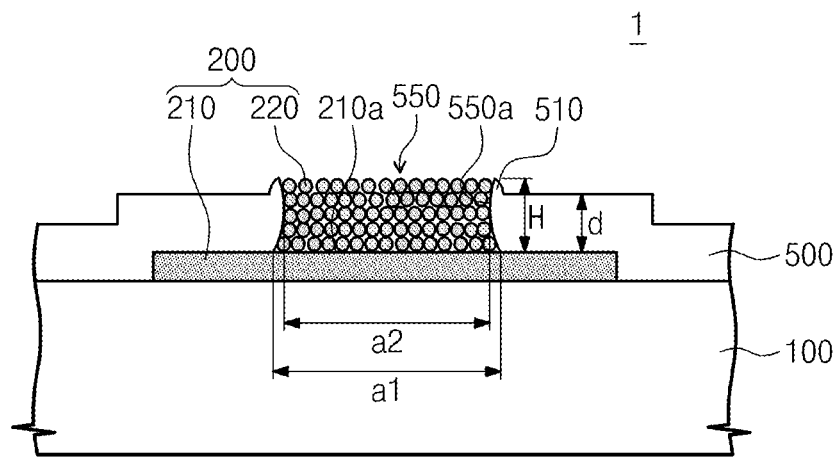
FIG. 2 is a sectional view taken along a line A-A' of FIG. 1.
Figure 3:
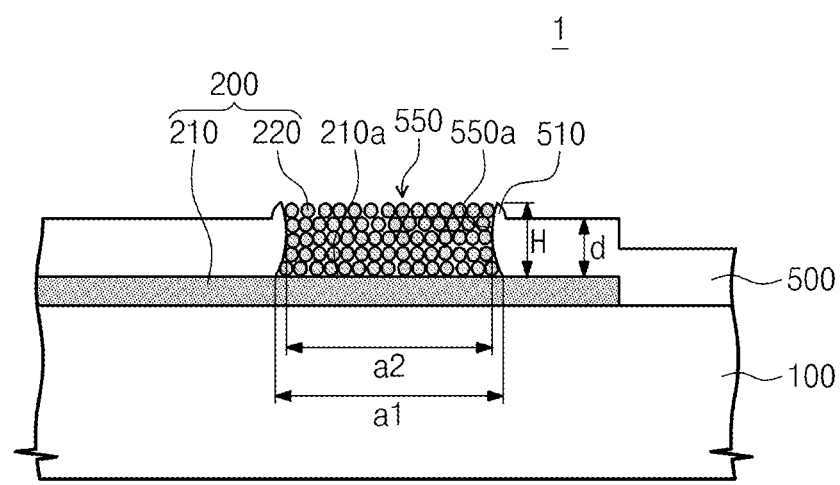
FIG. 3 is a sectional view taken along a line B-B' of FIG. 1.

FIG. 1 is a plan view illustrating an electrode sensor according to example embodiments of the inventive concept. FIGS. 2 and 3 are sectional views taken along lines A-A' and B-B', respectively, of FIG. 1.

Referring to FIGS. 1 through 3, an electrode sensor 1 may include an electrode 200 and an insulating layer 500 provided on a substrate 100. The electrode 200 may include a first electrode 210 and a second electrode 220.

The first electrode 210 may be provided on the substrate 100 to cover a portion of the substrate 100. The substrate 100 may be transparent. The substrate 100 may include at least one of glass, plastic, indium tin oxide (ITO), and/or fluorine-containing tin oxide (FTO). The first electrode 210 may be formed of a metal layer and have at least one pattern. For example, as shown in FIG. 1, the first electrode 210 may include a circular portion and a rectangular portion extending from the circular portion, in plan view. The second electrode 220 may be provided on the circular portion of the first electrode 210. The rectangular portion of the first electrode 210 may be connected to an external element. Signal to be measured by the second electrode 220 may be transmitted to the outside through the first electrode 210. The first electrode 210 may include at least one of gold (Au), platinum (Pt), iridium (Ir), indium tin oxide (ITO), and/or conductive polymer.

The insulating layer 500 may be provided on the substrate 100. The insulating layer 500 may be formed to cover and protect a portion of the first electrode 210. The insulating layer 500 may be formed to have a well 550 exposing a portion of the first electrode 210. A surface 210a of the first electrode 210 exposed by the well 550 may be flat or planarized. Accordingly, the electrode 200 may have a specific impedance value. The well 550 may have a circular structure in plan view and have an undercut-shaped side surface 550a. For example, a bottom diameter a1 of the well 550 may be greater than an intermediate diameter a2 thereof. Here, the bottom diameter a1 of the well 550 may be measured at a level, where the well 550 is in contact with the first electrode 210, and the intermediate diameter a2 of the well 550 may be measured at half the depth of the well 550. The insulating layer 500 may include a protruding portion 510 extending along a boundary of the well 550. The well 550 may have a depth H that is greater than a thickness d of the insulating layer 500, due to the presence of the protruding portion 510. The insulating layer 500 may include at least one of silicon oxide ($SiO_2$), silicon nitride ($Si_3N_4$), zinc oxide (ZnO), and/or aluminum oxide ($Al_2O_3$).

The second electrode 220 may be provided in the well 550 to fill the well 550. The second electrode 220 may have a circular section. The second electrode 220 may include gold (Au) and/or platinum (Pt). The second electrode 220 may include nano particles stacked in the well 550. In other embodiments, the second electrode 220 may include nano wires and/or nano-rods. Since the second electrode 220 is formed to fill the well 550, it may have an undercut-shaped side surface. The second electrode 220 may be configured to sense a signal and be electrically connected to the first electrode 210. Since the electrode 200 includes the second electrode 220 consisting of nano particles, it may have an increased surface area, compared with the case without the second electrode 220. Accordingly, the electrode 200 may have reduced impedance.

Figure 4:
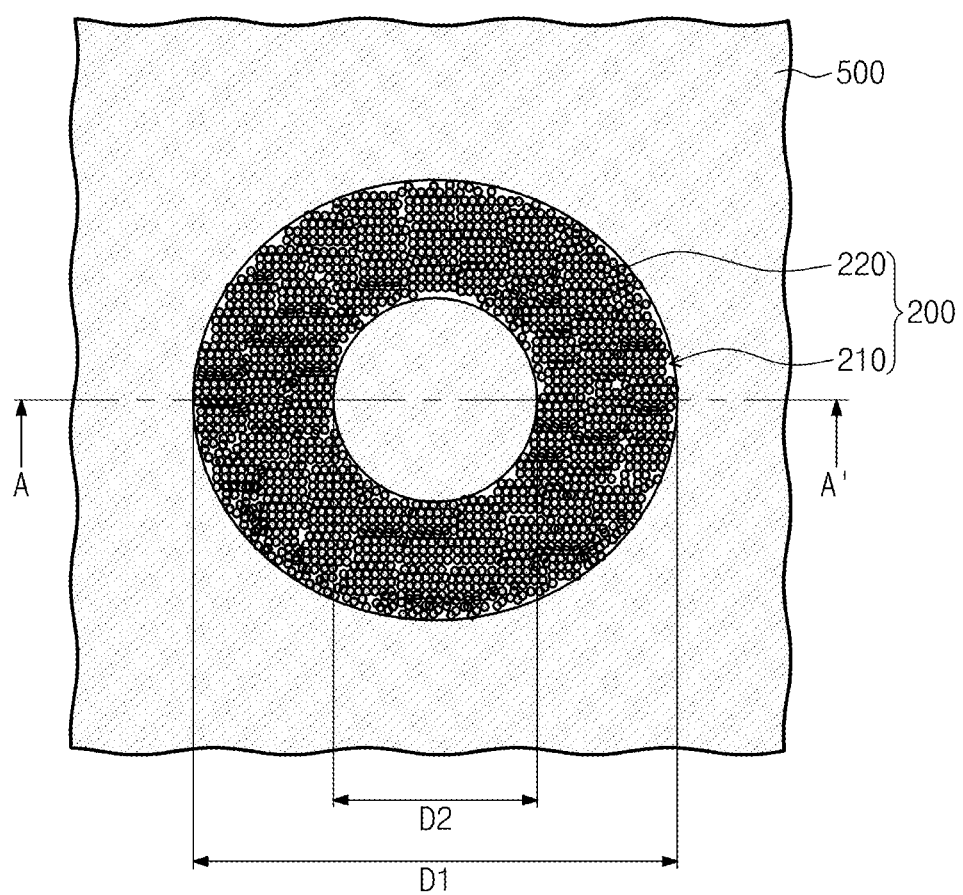
FIG. 4 is a plan view illustrating an electrode sensor according to other example embodiments of the inventive concept.
Figure 5:
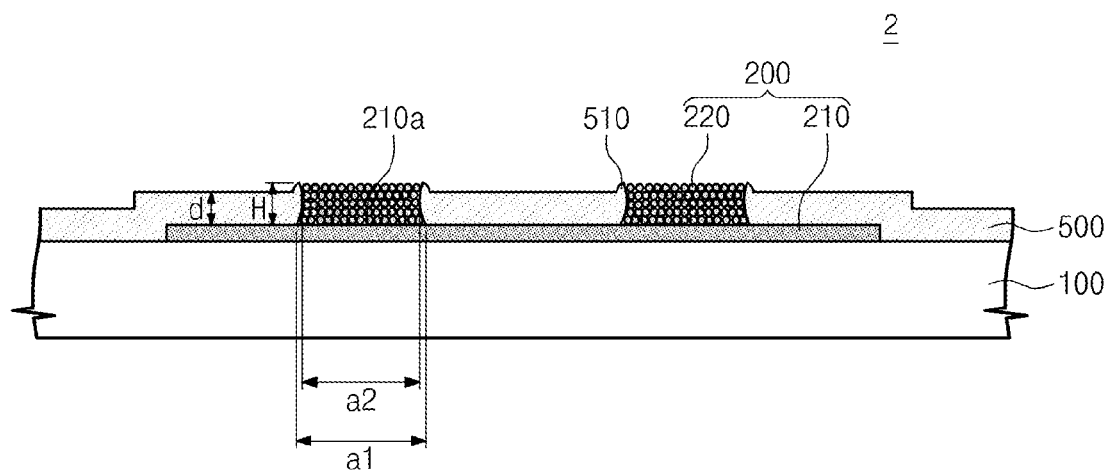
FIG. 5 is a sectional view taken along a line A-A' of FIG. 4.

FIG. 4 is a plan view illustrating an electrode sensor according to other example embodiments of the inventive concept. FIG. 5 is a sectional view taken along a line A-A' of FIG. 4. For concise description, overlapping description of elements previously described with reference to FIGS. 1 through 3 may be omitted.

Referring to FIGS. 4 and 5, an electrode sensor 2 may include the electrode 200 and the insulating layer 500 provided on the substrate 100. The electrode 200 may include the first electrode 210 and the second electrode 220. Each of the substrate 100, the insulating layer 500, the first electrode 210, and the second electrode 220 may include the same material as that described with reference to FIG. 1.

The first electrode 210 may be provided on the substrate 100 and have at least one pattern. The insulating layer 500 may include the well 550 exposing a portion of the first electrode 210. The surface 210a of the first electrode 210 exposed by the well 550 may be flat. The insulating layer 500 may be formed to cover and protect a portion of the first electrode 210. The insulating layer 500 may have the protruding portion 510 extending along the boundary of the well 550 and covering the top surface of the insulating layer 500. The well 550 may have the depth H that is greater than the thickness d of the insulating layer 500, due to the presence of the protruding portion 510. The well 550 may have an undercut-shaped vertical section and a circular-ring-shaped horizontal section. For example, a bottom diameter a1 of the well 550 may be greater than an intermediate diameter a2 of the well 550. The second electrode 220 may be provided in the well 550 and thereby fill the well 550. The second electrode 220 may include nano particles stacked in the well 550. In other embodiments, the second electrode 220 may include nano wires and/or nano-rods. The second electrode 220 may have an undercut-shaped vertical section and a circular-ring-shaped horizontal section.

The electrode sensor 2 may be or serve as a nerve electrode array. The electrode 200 may have a circular structure, due to the presence of the second electrode 220. The substrate 100 and the insulating layer 500 may be transparent. A nerve cell may be provided on the nerve electrode sensor 2 and in a circle with a diameter of D2. The use of the nerve electrode sensor 2 makes it possible to observe a nerve cell through a region with the diameter of D2 and measure a signal of the nerve cell through the second electrode 220.

Figure 6:
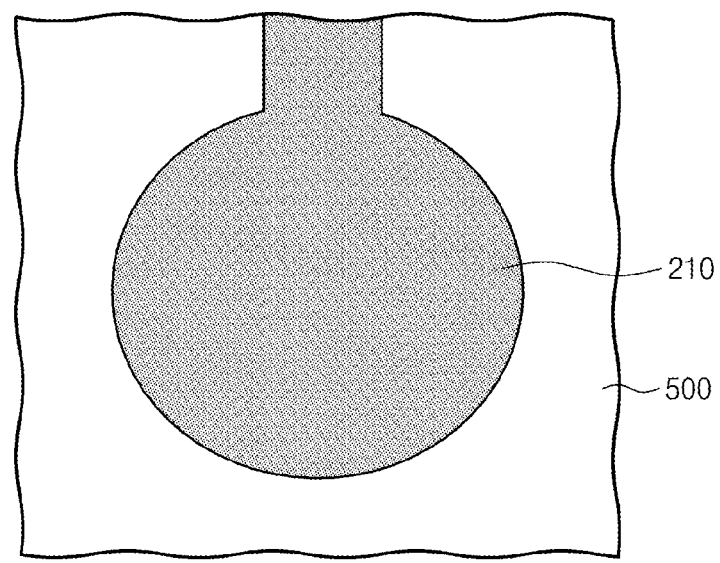
FIGS. 6 through 11 are sectional views illustrating a method of fabricating an electrode sensor, according to example embodiments of the inventive concept.
Figure 7:
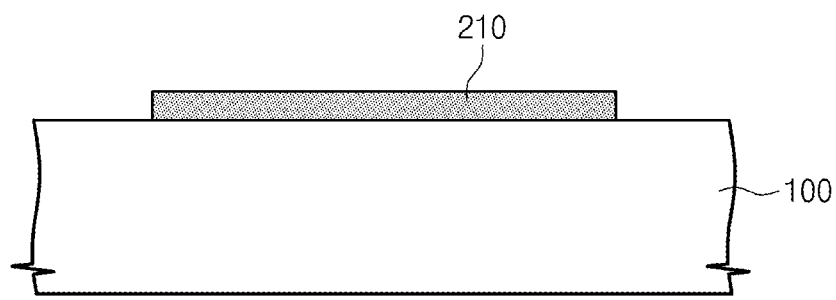

FIGS. 6 through 11 are sectional views illustrating a method of fabricating an electrode sensor, according to example embodiments of the inventive concept. FIG. 7 is a sectional view taken along a line A-A' of FIG. 6. For concise description, overlapping description of elements previously described with reference to FIGS. 1 through 3 may be omitted.

Referring to FIGS. 6 and 7, the substrate 100 with the first electrode 210 may be provided. The substrate 100 and the first electrode 210 may be configured to have substantially the same technical features as those described with reference to FIG. 1. The first electrode 210 may be formed by a patterning process and include a circular portion and a rectangular portion extending from the circular portion, in plan view.

Figure 8:
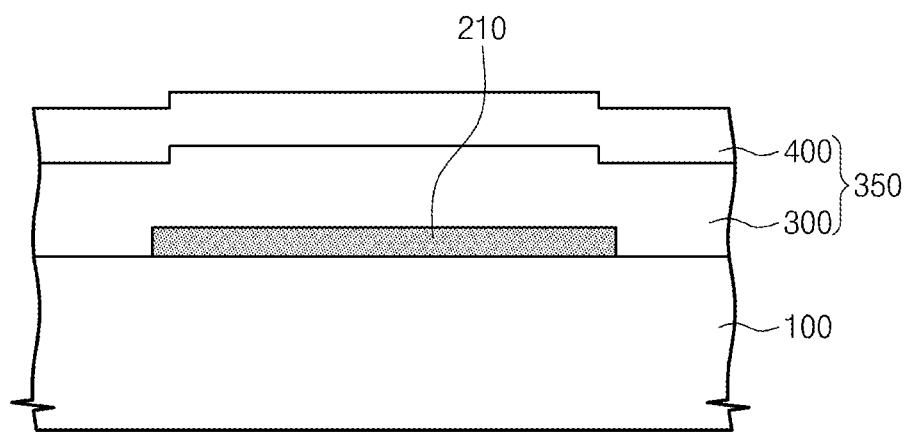

Referring to FIG. 8, a resist layer 350 may be formed on the substrate 100. The resist layer 350 may include a lift-off resist layer 300 and a photoresist layer 400 stacked in a sequential manner. For example, the lift-off resist layer 300 may be formed by coating SF 15 (available from Micro-Chem) on the substrate 100 using a spin-coating technique to cover the first electrode 210. The photoresist layer 400 may be formed by forming a negative-type photoresist (e.g., AZ nLOF™ 2100 available from AZ Electronic Materials) on the lift-off resist layer 300 using a spin-coating technique.

Figure 9:
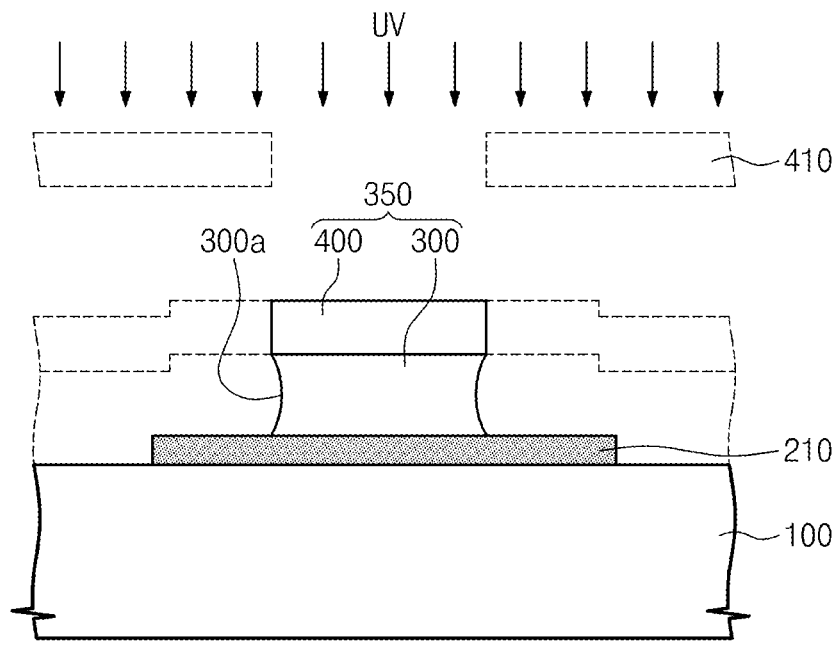

Referring to FIG. 9, the resist layer 350 may be patterned to expose a portion of the first electrode 210. A lithography process using a photomask 410 may be performed to patterning the resist layer 350. The photoresist layer 400 exposed by the photomask 410 may be exposed by ultraviolet light. A portion of the photoresist layer 400 and a portion of the lift-off resist layer 300 may be removed by developing solution. In example embodiments, AZ 300 MIF (available from AZ Electronic Materials) may be used for the developing solution. The exposed photoresist layer 400 and the lift-off resist layer 300 adjacent thereto may not be removed by the developing solution. In example embodiments, the remaining lift-off resist layer 300 may have an undercut-shaped side surface 300a.

Figure 10:
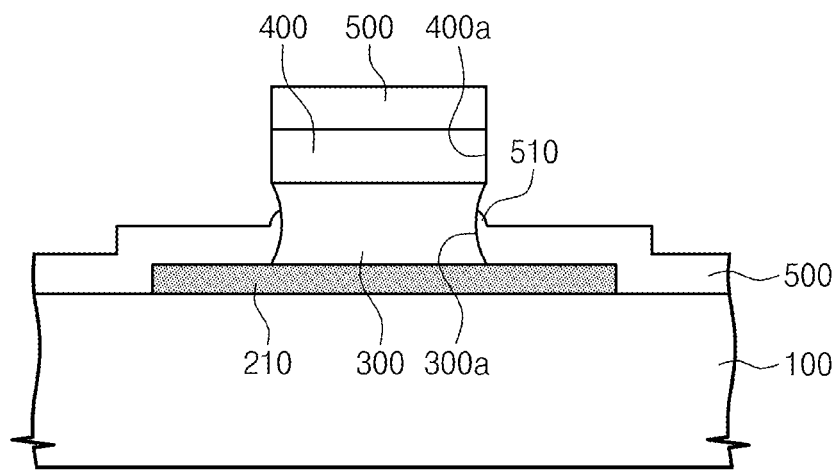

Referring to FIG. 10, the insulating layer 500 may be formed on the substrate 100. For example, the insulating layer 500 may be formed on the first electrode 210 exposed by the photoresist layer 400. In addition, the insulating layer 500 may also be formed on the photoresist layer 400. The substrate 100 may be washed, e.g., with water, before the formation of the insulating layer 500. The insulating layer 500 may be formed through a radio frequency (RF) sputtering technique. Owing to high kinetic energy of plasma, plasma surface diffusion may occur on the side surface 300a of the lift-off resist layer 300 and/or a side surface 400a of the photoresist layer 400, during the sputtering process. Accordingly, the insulating layer 500 may include the protruding portion 510 upward extending along the side surface 300a of the lift-off resist layer 300 and/or the side surface 400a of the photoresist layer 400. The insulating layer 500 may be formed to include at least one of materials described with reference to FIG. 1. A process temperature may be controlled during the formation of the insulating layer 500. For example, a structure of the lift-off resist layer 300 may be changed, if it is exposed at a temperature higher than its glass transition temperature (e.g., 180-190° C.), and thus, to prevent the lift-off resist layer 300 from being transformed, cooling water may be used to control a temperature of the sputtering process.

Figure 11:
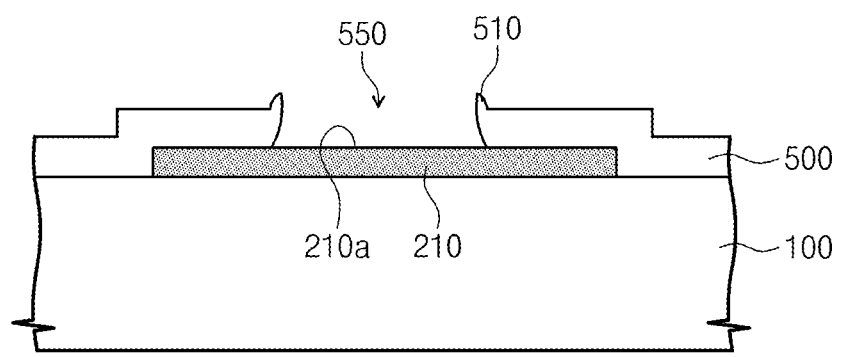
Figure 12:
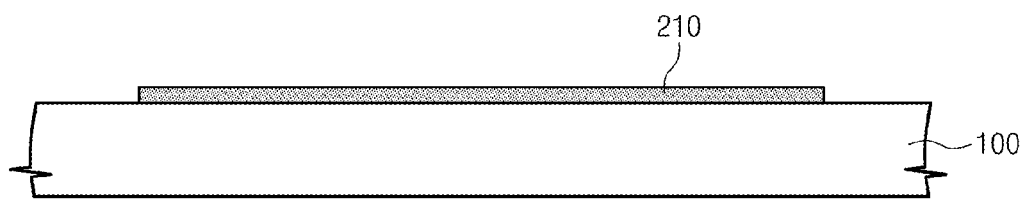
FIGS. 12 through 17 are sectional views illustrating a method of fabricating a nerve electrode sensor, according to other example embodiments of the inventive concept.

Referring to FIG. 11, a lift-off process may be performed to form the well 550 in the insulating layer 500. The well 550 may be formed to expose a portion of the first electrode 210. For example, the lift-off resist layer 300, the photoresist layer 400, and the insulating layer 500 on the photoresist layer 400 may be removed. In example embodiments, the lift-off process may be performed using a developer (e.g., AZ 300 MIF available from AZ Electronic Materials) and/or a lift-off resist remover (e.g., Remover PG from Micro-Chem and/or N-methyl pyridine). A structure of the well 550 may be modified or adjusted by controlling a thickness of the lift-off resist layer 300 and/or a thickness of the insulating layer 500. The exposed surface 210a of the first electrode 210 may be flat or have a planarized profile.

Referring back to FIGS. 1 through 3, the second electrode 220 may be formed in the well 550 to be in contact with the first electrode 210. The formation of the second electrode 220 may include filling the well 550 with gold-containing and/or platinum-containing nano particles. For example, the second electrode 220 may be formed by an electrodeposition process. An electrolyte solution may be prepared by dissolving HAuCl4 in sulfuric acid. KCl saturated solution and an Ag/AgCl electrode in the saturated solution may be used as reference electrode. A platinum electrode may be used as the reference electrode. In example embodiments, the electrodeposition process may be performed with a specific voltage (e.g., −0.25V) for 10 minutes. In other embodiments, the electrodeposition process may be performed using a cyclo-voltammetric process. Accordingly, the fabrication of the electrode sensor 2 may be finished. The insulating layer 500 may be formed to include the protruding portion 510 extending along the well 550, and thus, an amount of nano particles filling the well 550 may be increased, compared with the case without the protruding portion 510. A surface area of the second electrode 220 may be increased, compared with the case without the protruding portion 510, and thus, the electrode sensor 2 may have reduced impedance. If the well 550 is formed by an etching process, the exposed surface 210a of the first electrode 210 may be damaged. By contrast, the electrode sensor 2 may be formed using the lift-off process, and thus, it is possible to prevent the surface 210a of the first electrode 210 in contact with the second electrode 220 from being damaged.

FIGS. 12 through 17 are sectional views illustrating a method of fabricating a nerve electrode sensor, according to other example embodiments of the inventive concept. For concise description, overlapping description of elements may be omitted Referring to FIG. 12, the substrate 100 with the first electrode 210 may be provided. The substrate 100 and the first electrode 210 may be configured to have substantially the same technical features as those described with reference to FIG. 1.

Figure 13:
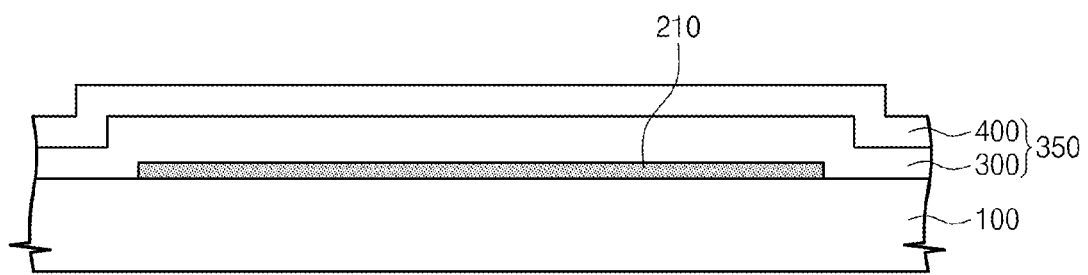

Referring to FIG. 13, the resist layer 350 may be formed on the substrate 100. The resist layer 350 may include the lift-off resist layer 300 and the photoresist layer 400 stacked in a sequential manner. The lift-off resist layer 300 and the photoresist layer 400 may be formed using the method previously described with reference to FIG. 8.

Figure 14:
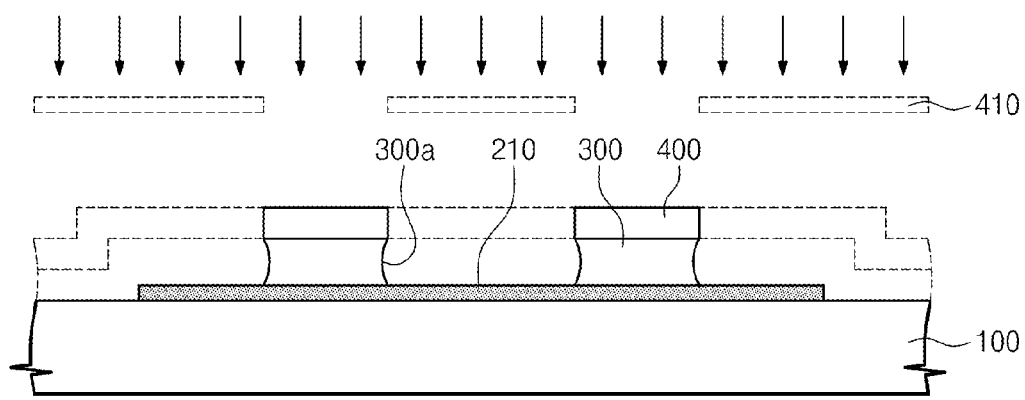

Referring to FIG. 14, the lift-off resist layer 300 and the photoresist layer 400 may be patterned to expose a portion of the first electrode 210. The patterning process may include a lithography process. For example, the photomask 410 with patterns may be formed on the photoresist layer 400. The photoresist layer 400 exposed by the photomask 410 may be exposed by ultraviolet light. A portion of the photoresist layer 400 and a portion of the lift-off resist layer 300 may be removed by developing solution. The exposed photoresist layer 400 and the lift-off resist layer 300 adjacent thereto may not be removed by the developing solution. In example embodiments, the remaining lift-off resist layer 300 may have the undercut-shaped side surface 300a.

Figure 15:
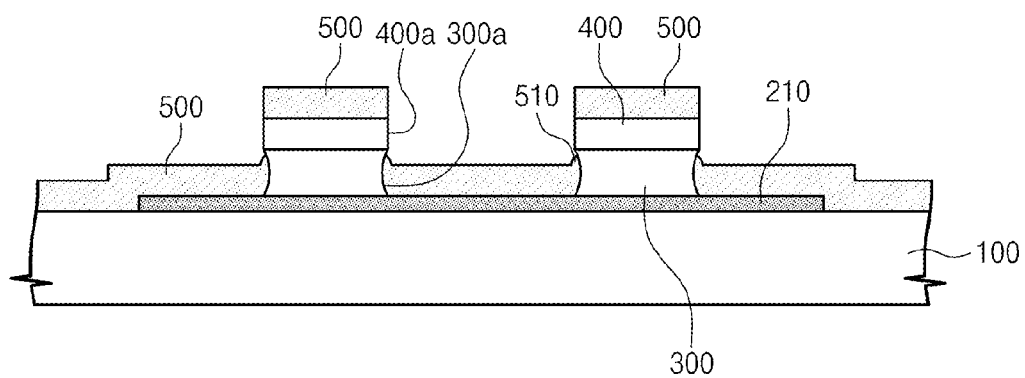

Referring to FIG. 15, the insulating layer 500 may be formed on the substrate 100. The insulating layer 500 may be formed on the first electrode 210 exposed by the photoresist layer 400. In addition, the insulating layer 500 may also be formed on the photoresist layer 400. The formation of the insulating layer 500 may be performed using the method described with reference to FIG. 10. As the result of plasma surface diffusion, the insulating layer 500 may be formed to include the protruding portion 510 extending along the side surface 300a of the lift-off resist layer 300 and/or the side surface 400a of the photoresist layer 400. The sputtering process may be performed at a temperature that is lower than a glass transition temperature (e.g., 180-190° C.) of the lift-off resist layer 300. For example, a process temperature of the sputtering process may be controlled using cooling water.

Figure 16:
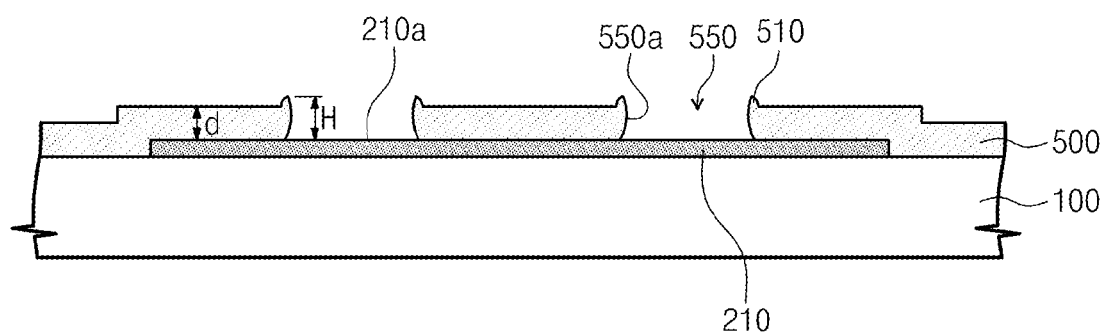

Referring to FIG. 16, the well 550 may be formed through the insulating layer 500 to expose the surface 210a of the first electrode 210. The well 550 may be formed using the lift-off process described with reference to FIG. 11. For example, the well 550 may be formed to have the convex-shaped side surface 550a. The structure of the well 550 may be modified or adjusted by controlling the thickness of the lift-off resist layer 300 and/or the thickness of the insulating layer 500. The well 550 may have the depth H that is greater than the thickness d of the insulating layer 500, due to the presence of the protruding portion 510. The use of the lift-off process makes it possible to reduce damage on the first electrode 210, compared with a use of an etching process. Accordingly, the exposed surface 210a of the first electrode 210 may be flat.

Referring back to FIGS. 4 and 5, the second electrode 220 may be formed in the well 550 to be in contact with the first electrode 210. Gold-containing and/or platinum-containing nano particles may be provided to form the second electrode 220 filling the well 550. For example, the second electrode 220 may be formed using an electrodeposition process described above.

Figure 17:
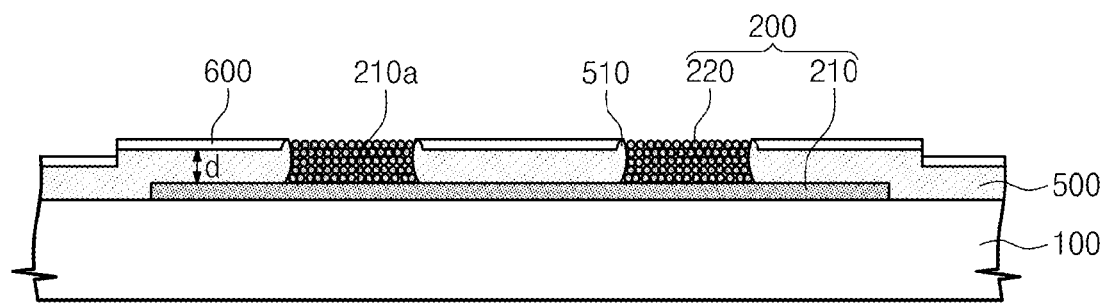

Referring to FIG. 17, a polymer layer 600 may be formed on the insulating layer 500. The polymer layer 600 may serve as a linker to be linked to a nerve cell. The nerve cell may be easily linked to the electrode sensor 2 by the polymer layer 600. The formation of the polymer layer 600 may be omitted.

Hereinafter, electrical characteristics of the electrode sensor will be described in more detail with reference to FIG. 18.

Figure 18:
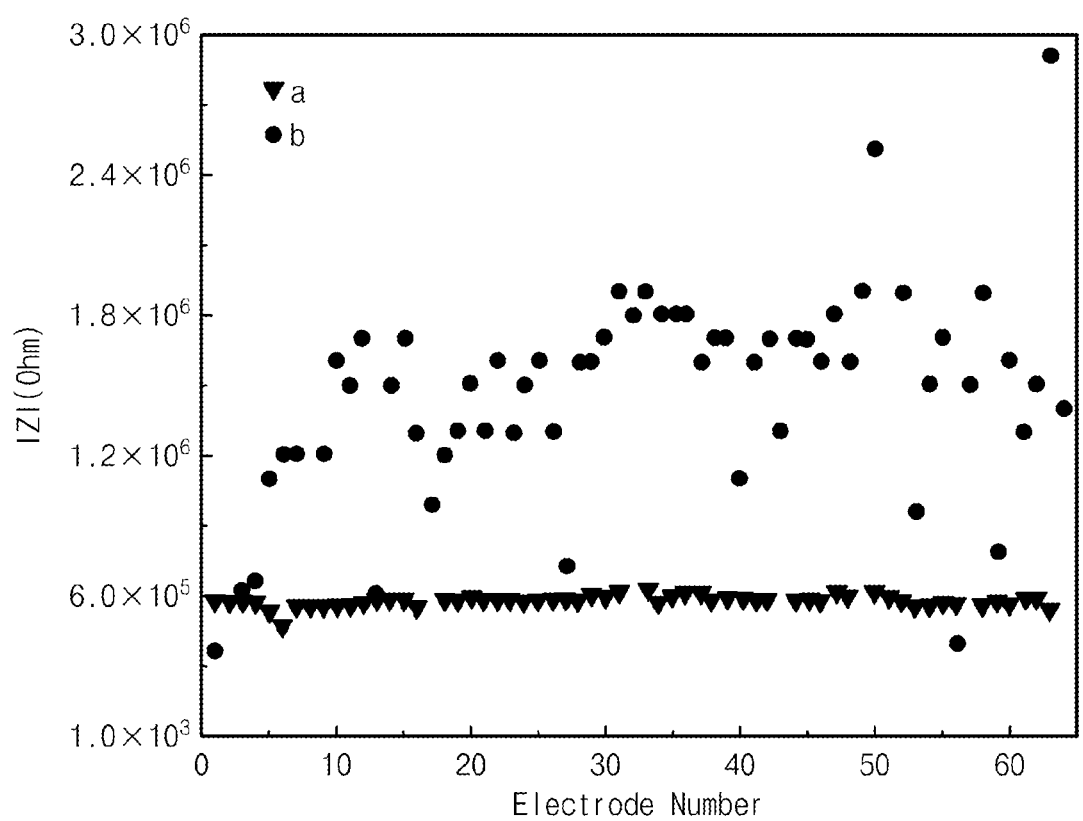
FIG. 18 is a graph of measured impedance of an electrode sensor according to experimental example of the inventive concept.

FIG. 18 is a graph showing impedance measured from an electrode sensor, according to experimental example of the inventive concept. The electrode sensor 1 fabricated by the process of FIGS. 6 through 11 was used for the experimental examples (a). An electrode sensor, in which a well was formed by a reactive ion etching, was used for comparative examples (b). Impedance was measured from 60 experimental examples (a) and 60 comparative examples (b) under a condition of 1 kHz. An x-axis shows serial numbers of fabricated electrode sensors, while a y-axis is measured impedance. Hereinafter, impedance characteristics of the experimental and comparative examples will be described with reference to FIGS. 1 through 3 and 18.

Referring to FIG. 18, the experimental examples (a) had lower impedance than the comparative examples (b). In the case of the experimental example (a), the insulating layer 500 has the protruding portion 510, and thus, it is possible to provide more nano particles in the well 550, when compared with the case of the comparative example (b). Accordingly, it is possible to increase a surface area of the second electrode 220 and to reduce impedance of the electrode 200. Further, in the case of the comparative example (b), the surface 210a of the first electrode 210 may be partially etched to have a rough profile. By contrast, the electrode sensor 1 may be formed by a lift-off resist process, and thus, the surface 210a of the first electrode 210 in contact with the second electrode 220 may not be damaged to be flat. Accordingly, the experimental example (a) may provide improved uniformity of impedance characteristics, compared with the case of the comparative examples (b).

According to example embodiments of the inventive concept, the electrode sensor may include a first electrode provided in a form of a thin film and a second electrode electrically connected to the first electrode. The second electrode may be configured to include nano particles provided in a well, and thus, the second electrode can have an increased surface area. This makes it possible to reduce impedance of the electrode.

According to example embodiments of the inventive concept, a lithography process and a lift-off process may be used to form the well in the insulating layer, and thus, it is possible to prevent the exposed surface of the first electrode from being damaged. Accordingly, the electrode can have uniform impedance characteristics. In the case where the electrode sensor is configured to have a section shaped like a circular ring, it is possible to observe a nerve cell and measure a signal from the nerve cell.

The insulating layer may be formed using a plasma process and thereby have a protruding portion allowing to provide more nano particles in the well. Accordingly, the second electrode can have an increased surface area, and it is possible to reduce impedance of the electrode.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating an electrode sensor, comprising:
providing a substrate with a first electrode;
forming a resist layer on the substrate to cover the first electrode;
patterning the resist layer to expose a portion of the first electrode;
forming an insulating layer on the substrate;
removing the insulating layer on the resist layer and the resist layer to form a well in the insulating layer; and
forming a second electrode in the well to be electrically connected to the first electrode.

2. The method of claim 1, wherein the forming of the resist layer comprises:
forming a lift-off resist layer on the substrate; and
forming a photoresist layer on the lift-off resist layer.

3. The method of claim 1, wherein the insulating layer is formed on the exposed portion of the first electrode and the resist layer.

4. The method of claim 1, wherein the removing of the insulating layer is performed using developing solution or lift-off resist remover.

5. The method of claim 1, wherein the insulating layer is formed to include a protruding portion provided around the resist layer.

6. The method of claim 1, wherein the forming of the well comprises patterning the insulating layer to have a circular ring shape in plan view, and
the forming of the second electrode comprises filling the well with nano particles to form the second electrode having the circular ring shape.

7. The method of claim 1, wherein the forming of the well comprises patterning the insulating layer to have a circular disc shape in plan view, and
the forming of the second electrode comprises filling the well with nano particles to form the second electrode having the circular disc shape.

* * * * *